US006968303B1

(12) United States Patent
Wang et al.

(10) Patent No.: US 6,968,303 B1
(45) Date of Patent: Nov. 22, 2005

(54) AUTOMATED SYSTEM FOR EXTRACTING AND COMBINING TOOL TRACE DATA AND WAFER ELECTRICAL TEST (WET) DATA FOR SEMICONDUCTOR PROCESSING

(75) Inventors: Qingsu Wang, Austin, TX (US); Elfido Coss, Jr., Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 572 days.

(21) Appl. No.: 09/548,443

(22) Filed: Apr. 13, 2000

(51) Int. Cl.[7] ............................................. G06F 17/50
(52) U.S. Cl. .............................. 703/13; 703/6; 703/14; 703/21
(58) Field of Search ................................ 703/6, 21, 13, 703/14

(56) References Cited

U.S. PATENT DOCUMENTS 5,621,652 A * 4/1997 Eakin ............................ 716/5
5,719,796 A * 2/1998 Chen ........................... 703/13
6,161,213 A * 12/2000 Lofstrom ...................... 716/4

OTHER PUBLICATIONS

Shindo et al., "A Study for Designing QC Information System", Proceedings of the Sixth IEEE/CHMT International Electronic Manufacturing Technology Symposium, Apr. 1989, pp. 356-359.*
Lee et al., "IC Performance Prediction for Test Cost Reduction", Proceedings of 1999 IEEE International Symposium on Semiconductor Manufacturing Conference, Oct. 1999, pp. 111-114.*

* cited by examiner

Primary Examiner—Jean R. Homere
Assistant Examiner—Herng-der Day
(74) Attorney, Agent, or Firm—Williams, Morgan & Amerson

(57) ABSTRACT

A method is provided for configuring a final data set to use for modeling a manufacturing process, the method including requesting a real-time data set from a real-time database, requesting an historical data set from an historical database, and defining a required format for the final data set. The method also includes combining the real-time data set from the real-time database with the historical data set from the historical database using the required format for the final data set.

40 Claims, 9 Drawing Sheets

AUTOMATED SYSTEM FOR EXTRACTING AND COMBINING TOOL TRACE DATA AND WAFER ELECTRICAL TEST (WET) DATA FOR SEMICONDUCTOR PROCESSING

BACKGROUND OF THE INVENTION

1. Field of the Invention

This invention relates generally to semiconductor fabrication technology, and, more particularly, to a method for semiconductor fabrication supervision and optimization.

2. Description of the Related Art

There is a constant drive within the semiconductor industry to increase the quality, reliability and throughput of integrated circuit devices, e.g., microprocessors, memory devices, and the like. This drive is fueled by consumer demands for higher quality computers and electronic devices that operate more reliably. These demands have resulted in a continual improvement in the manufacture of semiconductor devices, e.g., transistors, as well as in the manufacture of integrated circuit devices incorporating such transistors. Additionally, reducing defects in the manufacture of the components of a typical transistor also lowers the overall cost per transistor as well as the cost of integrated circuit devices incorporating such transistors.

The technologies underlying semiconductor processing tools have attracted increased attention over the last several years, resulting in substantial refinements. However, despite the advances made in this area, many of the processing tools that are currently commercially available suffer certain deficiencies. In particular, such tools often lack advanced process data monitoring capabilities, such as the ability to provide historical parametric data in a user-friendly format, as well as event logging, real-time graphical display of both current processing parameters and the processing parameters of the entire run, and remote, i.e., local site and worldwide, monitoring. These deficiencies can engender nonoptimal control of critical processing parameters, such as throughput accuracy, stability and repeatability, processing temperatures, mechanical tool parameters, and the like. This variability manifests itself as within-run disparities, run-to-run disparities and tool-to-tool disparities that can propagate into deviations in product quality and performance, whereas an ideal monitoring and diagnostics system for such tools would provide a means of monitoring this variability, as well as providing means for optimizing control of critical parameters.

Among the parameters it would be useful to monitor and control are critical dimensions (CDs) and doping levels for transistors (and other semiconductor devices), as well as overlay errors in photolithography. CDs are the smallest feature sizes that particular processing devices may be capable of producing. For example, the minimum widths w of polycrystalline (polysilicon or poly) gate lines for metal oxide semiconductor field effect transistors (MOSFETs or MOS transistors) may correspond to one CD for a semiconductor device having such transistors. Similarly, the junction depth $d_j$ (depth below the surface of a doped substrate to the bottom of a heavily doped source/drain region formed within the doped substrate) may be another CD for a semiconductor device such as an MOS transistor. Doping levels may depend on dosages of ions implanted into the semiconductor devices, the dosages typically being given in numbers of ions per square centimeter at ion implant energies typically given in keV.

However, traditional statistical process control (SPC) techniques are often inadequate to control precisely CDs and doping levels in semiconductor and microelectronic device manufacturing so as to optimize device performance and yield. Typically, SPC techniques set a target value, and a spread about the target value, for the CDs, doping levels, and/or overlay errors in photolithography. The SPC techniques then attempt to minimize the deviation from the target value without automatically adjusting and adapting the respective target values to optimize the semiconductor device performance, as measured by wafer electrical test (WET) measurement characteristics, for example, and/or to optimize the semiconductor device yield and throughput. Furthermore, blindly minimizing non-adaptive processing spreads about target values may not increase processing yield and throughput.

Traditional control techniques are frequently ineffective in reducing off-target processing and in improving sort yields. For example, the wafer electrical test (WET) measurements are typically not performed on processed wafers until quite a long time after the wafers have been processed, sometimes not until weeks later. When one or more of the processing steps are producing resulting wafers that WET measurements indicate are unacceptable, causing the resulting wafers to be scrapped, this misprocessing goes undetected and uncorrected for quite a while, often for weeks, leading to many scrapped wafers, much wasted material and decreased overall throughput. Similarly, process and/or tool problems throughout the wafer processing are typically not analyzed fast enough, and final wafer yields are not evaluated on a die-by-die basis. Furthermore, data sets for making correlations between processing and/or tool trace data, on the one hand, and testing data, such as WET measurements, on the other, are typically manually extracted by the process engineers and put together, a very time-consuming procedure.

The present invention is directed to overcoming, or at least reducing the effects of, one or more of the problems set forth above.

SUMMARY OF THE INVENTION

In one aspect of the present invention, a method is provided for configuring a final data set to use for modeling a manufacturing process, the method including requesting a real-time data set from a real-time database, requesting an historical data set from an historical database, and defining a required format for the final data set. The method also includes combining the real-time data set from the real-time database with the historical data set from the historical database using the required format for the final data set.

In another aspect of the present invention, a computer-readable, program storage device is provided, encoded with instructions that, when executed by a computer, perform a method for configuring a final data set to use for modeling a manufacturing process, the method including requesting a real-time data set from a real-time database, requesting an historical data set from an historical database, and defining a required format for the final data set. The method also includes combining the real-time data set from the real-time database with the historical data set from the historical database using the required format for the final data set.

In yet another aspect of the present invention, a computer programmed to perform a method for configuring a final data set to use for modeling a manufacturing process is provided, the method including requesting a real-time data set from a real-time database, requesting an historical data set from an historical database, and defining a required format for the final data set. The method also includes combining the real-time data set from the real-time database with the historical data set from the historical database using the required format for the final data set.

BRIEF DESCRIPTION OF THE DRAWINGS

The invention may be understood by reference to the following description taken in conjunction with the accompanying drawings, in which the leftmost significant digit(s) in the reference numerals denote(s) the first figure in which the respective reference numerals appear, and in which:

FIGS. 1–3 and 6–9 schematically illustrate a flow chart for various embodiments of a method for manufacturing according to the present invention; and FIGS. 4–5 schematically illustrate critical dimension (CD) measurements of features formed on a workpiece and an MOS transistor representative of MOS transistors tested in various embodiments of a method for manufacturing according to the present invention.

Figure 1:
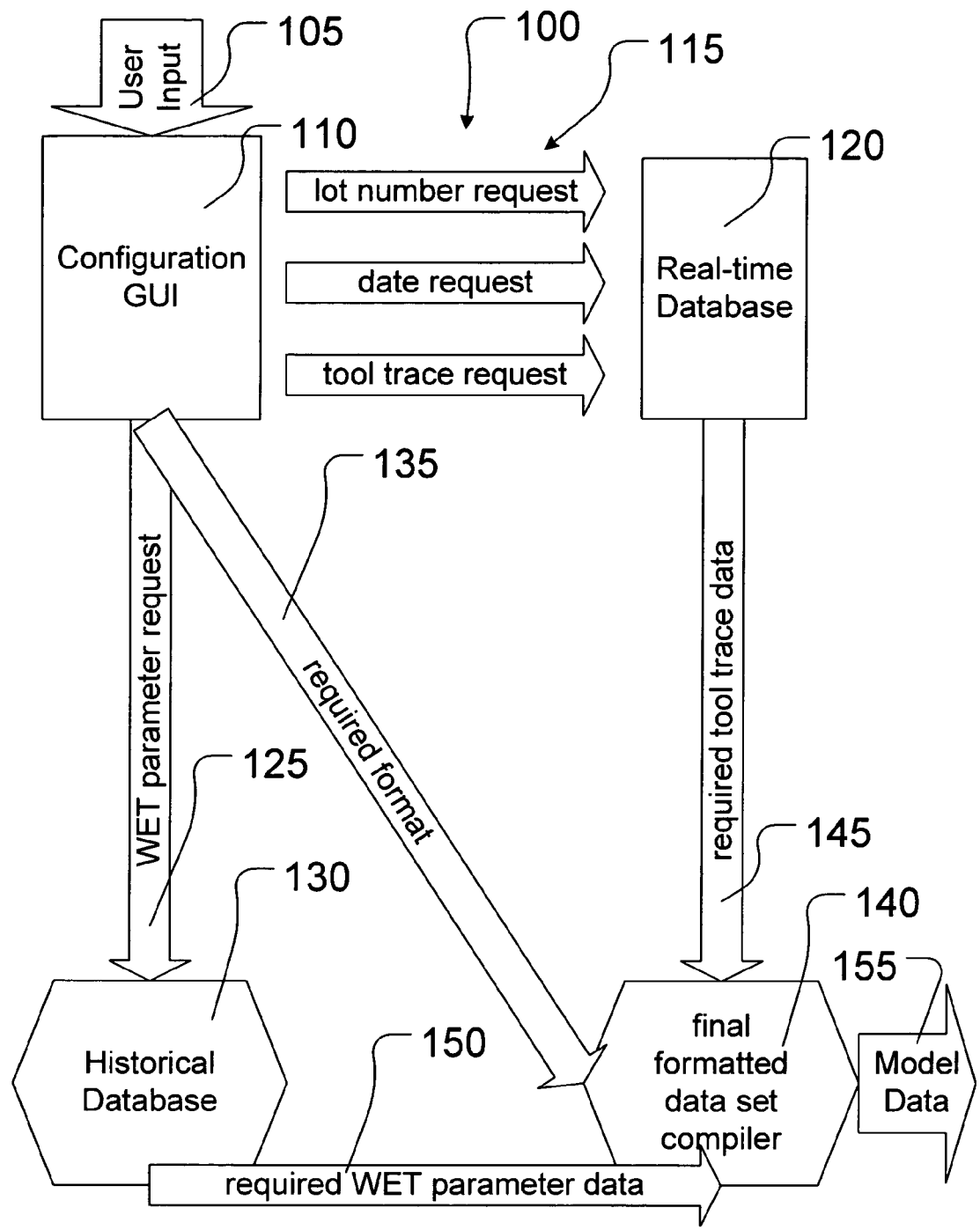
FIGS. 1–9 schematically illustrate various embodiments of a method for manufacturing according to the present invention; and, more particularly.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Illustrative embodiments of a method for manufacturing according to the present invention are shown in FIGS. 1–9. As shown in FIG. 1, a flow chart 100 for various embodiments of a method for manufacturing according to the present invention is schematically illustrated. As shown in FIG. 1, user input 105 may be entered into a user-friendly configuration graphic user interface (GUI) 110. The configuration GUI 110 is provided to configure a final data set, such as model data set 155. The model data set 155 may be used to build a model for the processing of one or more semiconducting devices such as an MOS transistor formed on a workpiece such as a semiconducting substrate or wafer.

Figure 2:
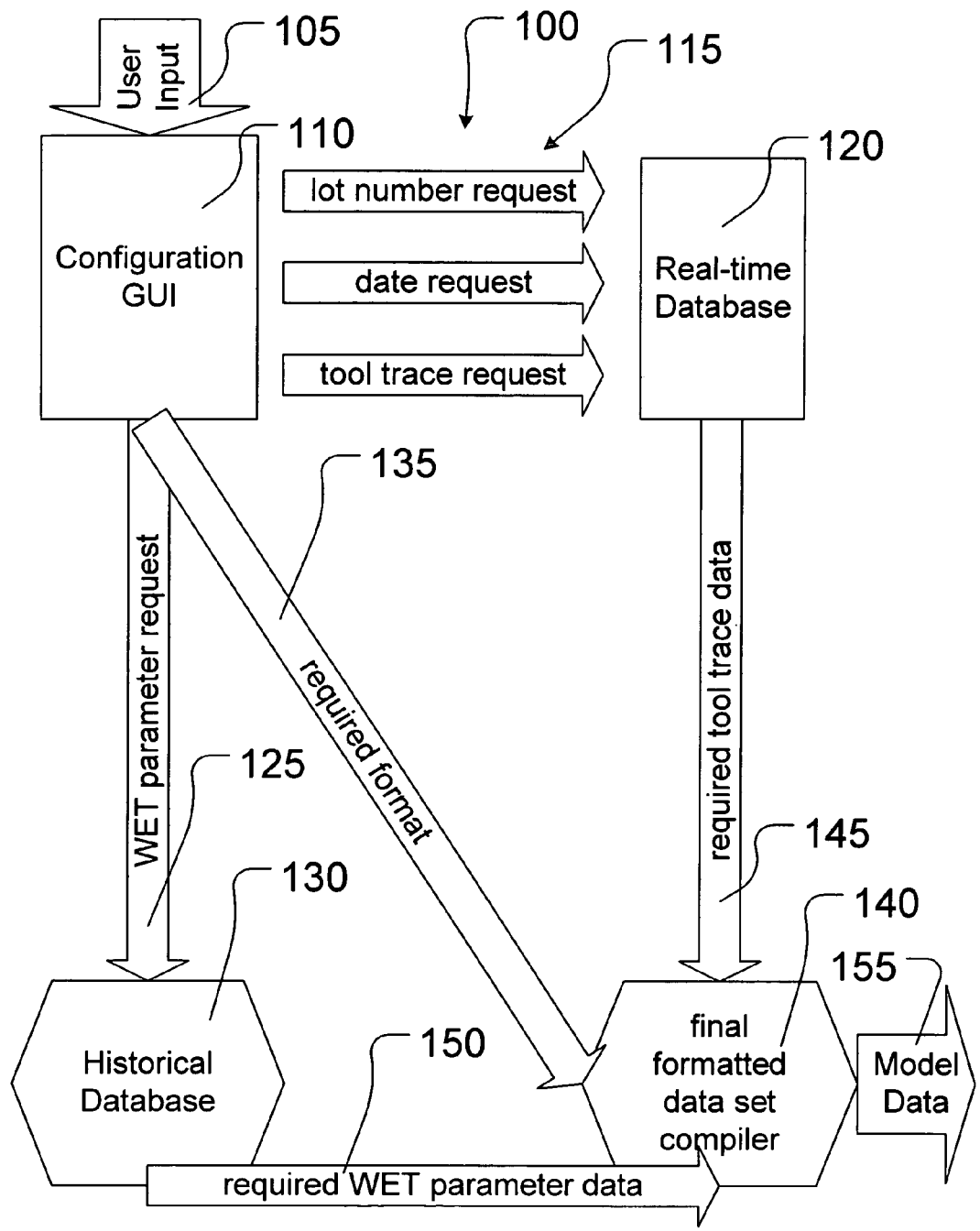

As shown in FIG. 2, one or more requests 115 may be sent from the configuration GUI 110 and delivered to a real-time database 120. The requests 115 may include tool trace requests, date requests and lot number requests, and the like. A tool trace may be a time trace report of the state of a processing tool taken at discrete time points, for example, once every second (a one Hz time trace). For example, if the processing tool were an etching tool, then the time trace report may trace the effective etching rate of the etching tool for a given period of time such as the duration of the etching of the workpiece.

Similarly, if the processing tool were a deposition tool, then the time trace report may trace the effective deposition rate of the deposition tool for a given period of time such as the duration of the deposition of a process layer of material on the workpiece. Likewise, if the processing tool were a rapid thermal anneal (RTA) tool, then the time trace report may trace the effective temperature of the RTA tool for a given period of time such as the duration of the RTA of the workpiece. Moreover, if the processing tool were a chemical mechanical polishing (CMP) tool, then the time trace report may trace the effective polishing rate of the CMP tool for a given period of time such as the duration of the CMP of the workpiece.

In addition, if the processing tool were a dopant implanting tool, then the time trace report may trace the effective dosage and/or energy of the dopant implanting for a given period of time such as the duration of the dopant implanting of the workpiece. Further, if the processing tool were a metrology and/or sensing and/or inspection tool, then the time trace report may trace the effective critical dimensions (CD's) measured and/or workpiece characteristics sensed and/or faults or defects found for a given period of time such as the duration of the measuring and/or sensing and/or inspecting of the workpiece.

The date requests may include information about the timing and sequencing of the processing performed by a particular processing tool, for example. The lot number requests may include information concerning the lot number or numbers associated with the particular workpiece and/or lot of workpieces and/or batch of workpieces processed by the particular processing tool.

Figure 3:
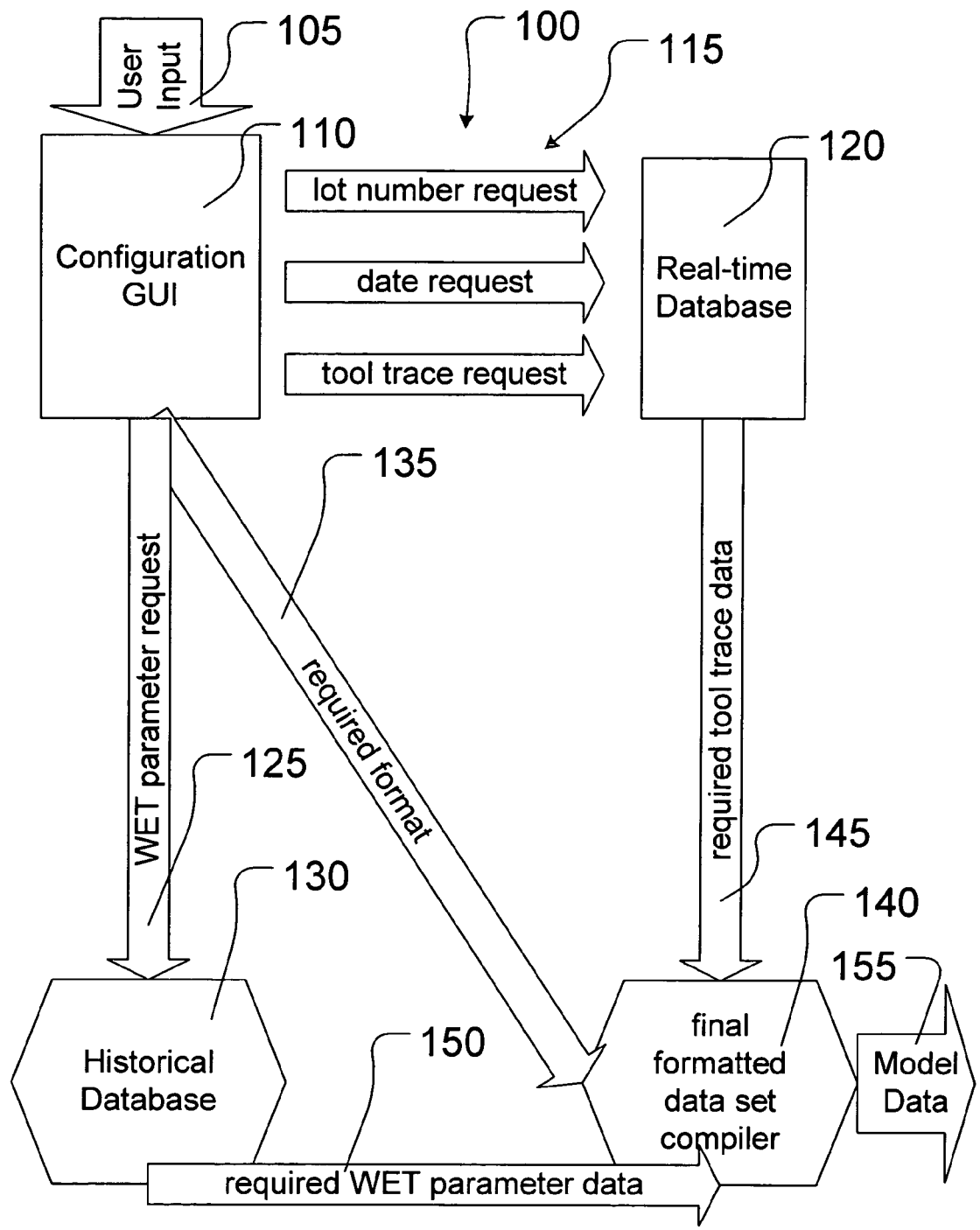

As shown in FIG. 3, one or more wafer electrical test (WET) parameter requests 125 may be sent from the configuration GUI 110 and delivered to an historical database 130, such as the Sapphire database. The WET parameter requests 125 may include requests for historical and/or archived WET parameter data related to the processing performed in one or more of the processing steps used for the processing of one or more semiconducting devices such as an MOS transistor formed on the workpiece.

Figure 4:
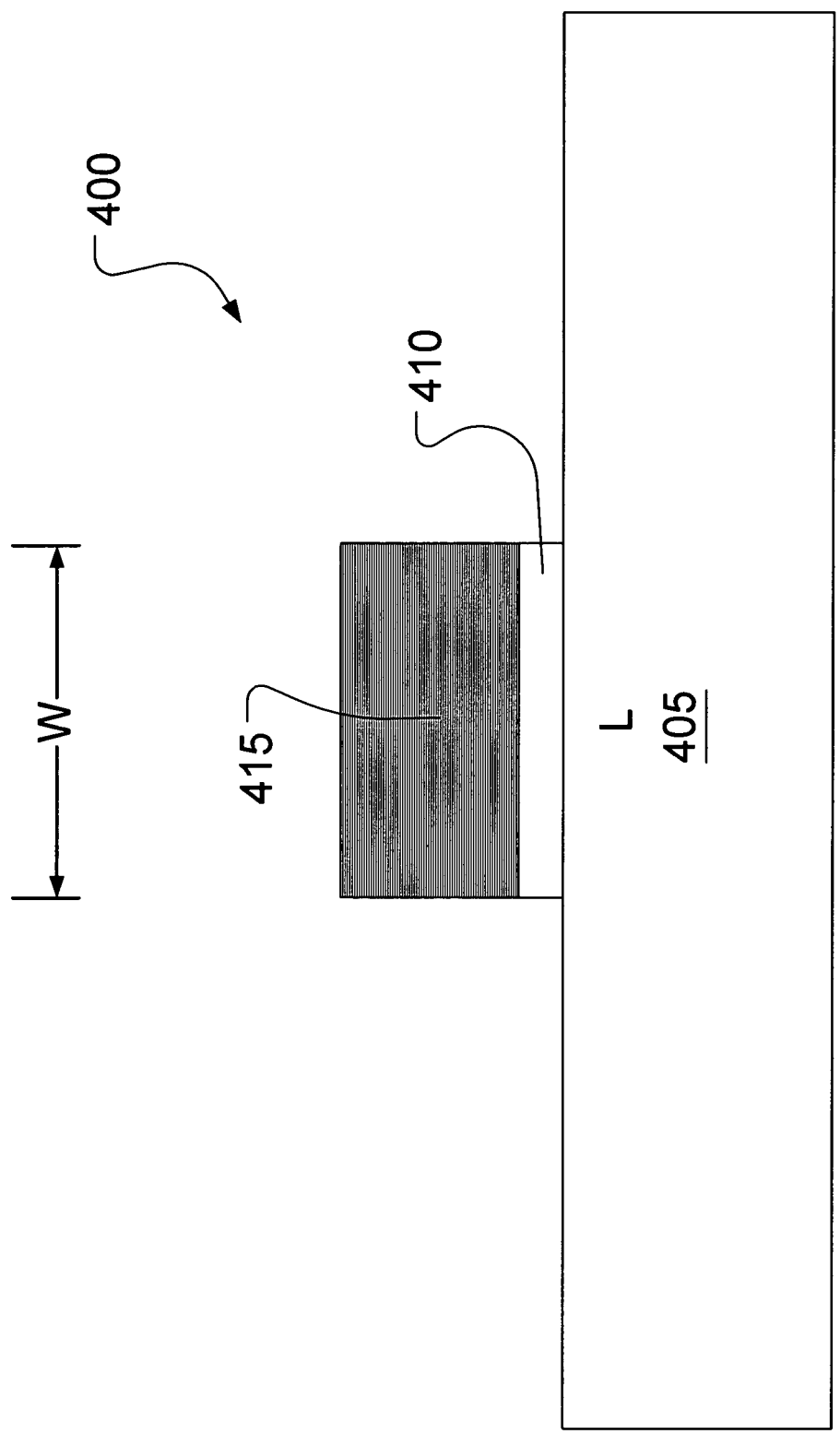
Figure 5:
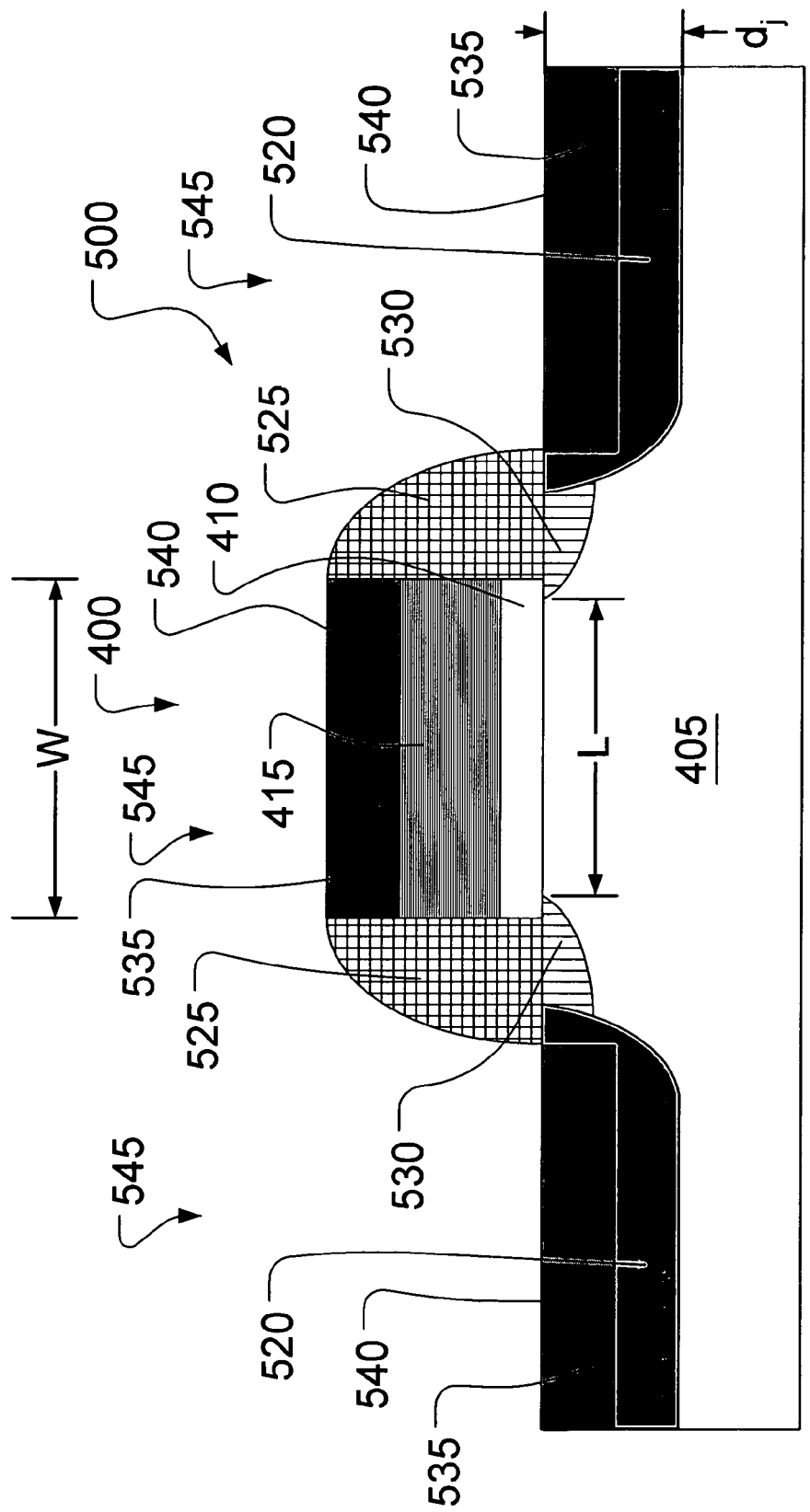

In various illustrative embodiments, the metrology or measuring tool trace data, requested from the real-time database 120 by the tool trace request 115, for example, may involve a critical dimension (CD) measurement of a structure formed on the workpiece 405. FIG. 4 schematically illustrates the CD measurement of a gate structure 400 formed on the workpiece 405. As shown in FIG. 4, a gate dielectric 410 for the gate structure 400 (for an MOS transistor 500 as shown in FIG. 5) may be formed above a structure layer 405, such as a semiconducting substrate (e.g., a silicon wafer). The gate dielectric 410 may be formed by a variety of known techniques for forming such layers, e.g., chemical vapor deposition (CVD), low-pressure CVD (LPCVD), plasma-enhanced CVD (PECVD), sputtering and physical vapor deposition (PVD), and the like, and may have a thickness ranging from approximately 100–2000 Å, for example. The gate dielectric 410 may be formed from a variety of dielectric materials and may, for example, be an oxide (e.g., Ge oxide), a nitride (e.g., GaAs nitride), an oxynitride (e.g., GaP oxynitride), silicon dioxide ($SiO_2$), a nitrogen-bearing oxide (e.g., nitrogen-bearing $SiO_2$), a nitrogen-doped oxide (e.g., $N_2$-implanted $SiO_2$), silicon nitride ($Si_3N_4$), silicon oxynitride ($Si_xO_yN_z$), and the like. In one illustrative embodiment, the gate dielectric 410 is comprised of a silicon dioxide (SiO$_2$) having a thickness of approximately 500 Å, which is formed by an LPCVD process for higher throughput.

As shown in FIG. 4, a polycrystalline silicon or poly gate conductive layer 415 for the gate structure 400 (for the MOS transistor 500 as shown in FIG. 5) may be formed above the gate dielectric 410. The poly gate conductive layer 415 may be formed by a variety of known techniques for forming such layers, e.g., CVD, LPCVD, PECVD, PVD, and the like, and may have a thickness ranging from approximately 500–2000 Å. In one illustrative embodiment, the poly gate conductive layer 415 has a thickness of approximately 1000 Å and is formed by an LPCVD process for higher throughput. The poly gate conductive layer 415 and the gate dielectric 410 together may constitute the gate structure 400.

As shown in FIG. 4, the measuring tool trace data, requested from the real-time database 120 by the tool trace request 115, for example, may involve the CD measurement of the width W of the gate structure 400. The width W of the gate structure 400 may be related to the channel length L of the MOS transistor 500 as shown in FIG. 5. Alternatively, as shown in FIG. 5, the measuring tool trace data, requested from the real-time database 120 by the tool trace request 115, for example, may involve the CD measurement of a junction depth $d_j$ of the MOS transistor 500. In various other alternative embodiments, the measuring tool trace data, requested from the real-time database 120 by the tool trace request 115, for example, may involve other measurements. The parameter and/or parameters measured in the measuring tool trace data, requested from the real-time database 120 by the tool trace request 115, for example, may be characteristic of the processing performed on the workpiece 405 in the respective processing step.

As shown in FIG. 5, a metal oxide semiconductor field effect transistor (MOSFET or MOS transistor) 500 may be formed on the semiconducting substrate 405, such as doped-silicon. The MOS transistor 500 may have the doped-poly gate 410 formed above the gate oxide 415 formed above the semiconducting substrate 405. The doped-poly gate 410 and the gate oxide 415 may be separated from N$^+$-doped (P$^+$-doped) source/drain regions 520 of the MOS transistor 500 by dielectric spacers 525. The dielectric spacers 525 may be formed above N$^-$-doped (P$^-$-doped) lightly doped drain (LDD) regions 530.

The N$^-$-doped (P$^-$-doped) LDD regions 530 are typically provided to reduce the magnitude of the maximum channel electric field found close to the N$^+$-doped (P$^+$-doped) source/drain regions 520 of the MOS transistor 500, and, thereby, to reduce the associated hot-carrier effects. The lower (or lighter) doping of the N$^-$-doped (P$^-$-doped) LDD regions 530, relative to the N$^+$-doped (P$^+$-doped) source/drain regions 520 of the MOS transistor 500, reduces the magnitude of the maximum channel electric field found close to the N$^+$-doped (P$^+$-doped) source/drain regions 520 of the MOS transistor 500, but increases the source-to-drain resistances of the N$^-$-doped (P$^-$-doped) LDD regions 530.

A titanium (Ti) metal layer (not shown) may have been blanket-deposited on the MOS transistor 500 and then subjected to an initial rapid thermal anneal (RTA) process performed at a temperature ranging from approximately 450–800° C. for a time ranging from approximately 15–60 seconds. At surfaces 540 of active areas 545, such as the N$^+$-doped (P$^+$-doped) source/drain regions 520 and the doped-poly gate 410, exposed Si reacts upon heating with the Ti metal to form a titanium silicide (TiSi$_2$) layer 535 the surfaces 540 of the active areas 545. The Ti metal is not believed to react with the dielectric spacers 525 upon heating. A wet chemical strip of the Ti metal removes excess, unreacted portions (not shown) of the Ti metal layer 535, leaving behind the self-aligned silicided (salicided) TiSi$_2$ layer 535 only at and below the surfaces 540 of the active areas 545. The salicided TiSi$_2$ 535 may then be subjected to a final RTA process performed at a temperature ranging from approximately 800–1000° C. for a time ranging from approximately 10–60 seconds.

As shown in FIG. 5, the MOS transistor 500 may be specified by several processing parameters. For example, the doped-poly gate 410 may have a width W that, in turn, determines a channel length L. The channel length L is the distance between the two metallurgical N$^-$-P (P$^-$-N) junctions formed below the gate oxide 415 for an N-MOS (P-MOS) transistor 500, the two metallurgical N$^-$-P (P$^-$-N) junctions being between the N$^-$-doped (P$^-$-doped) LDD regions 530 and the semiconducting substrate 405. Further, another junction (having a junction depth $d_j$) below the N$^+$-doped (P$^+$-doped) source/drain regions 520 may be formed between the N$^+$-doped (P$^+$-doped) source/drain regions 520 and the semiconducting substrate 405. The semiconducting substrate 405 may have a doping level $N_D$ ($N_A$) reflecting the density of donor (acceptor) impurities typically being given in numbers of ions per square centimeter for an N-type (P-type) semiconducting substrate 405. In addition, the N$^+$-doped (P$^+$-doped) source/drain regions 520 and the N$^-$-doped (P$^-$-doped) LDD regions 530 may each have respective doping levels $N_{D+}$ and $N_{D-}$ ($N_{A+}$ and $N_{A-}$). The respective doping levels may depend on dosages of ions implanted into the N$^+$-doped (P$^+$-doped) source/drain regions 520 and the N$^-$-doped (P$^-$-doped) LDD regions 530, the dosages typically being given in numbers of ions per square centimeter at ion implant energies typically given in keV. Further, the gate oxide 415 may have a thickness $t_{ox}$.

The WET parameters, requested from the historical database 130 by the WET parameter request 125, for example, may include current measurements and/or voltage responses of MOS transistors formed on the workpiece 405, for example, and/or capacitances and/or resistances and/or resistivities of elements of MOS transistors formed on the workpiece 405.

In various illustrative embodiments, characteristic parameters $y_\alpha$, $\alpha=1$ to $\alpha=m$, obtained using real-time, in-line process metrology, may be mapped to historical WET parameter values $x_\beta$, $\beta=1$ to $\beta=n$, in completed workpieces (such as workpiece 405) by the mapping $T^{-1}(y_\alpha)=x_\beta$. The characteristic parameters $y_\alpha$, $\alpha=1$ to $\alpha=m$, may be represented as m vectors each having s components, or, equivalently, as an s×m matrix $Y_{s\times m}$, whose m columns are the m vectors $y_\alpha$, $\alpha=1$ to $\alpha=m$:

$$Y_{s \times m} = (y_\alpha) = (y_1 \ \ldots \ y_m) = \begin{pmatrix} y_{11} & \cdots & y_{1m} \\ \vdots & \ddots & \vdots \\ y_{s1} & \cdots & y_{sm} \end{pmatrix}.$$

Similarly, the predicted WET resulting values $x_\beta$, $\beta=1$ to $\beta=n$, may be represented as n vectors each having t components, or, equivalently, as an t×n matrix $X_{t\times n}$ whose n columns are the n vectors $x_\beta$, $\beta=1$ to $\beta=n$:

$$X_{t \times n} = (x_\beta) = (x_1 \ldots x_n) = \begin{pmatrix} x_{11} & \ldots & x_{1n} \\ \vdots & \ddots & \vdots \\ x_{t1} & \ldots & x_{tn} \end{pmatrix}.$$

In various illustrative embodiments, the mapping $T^{-1}(y_\alpha) = x_\beta$ may be represented as multiplication of the s×m matrix $Y_{s \times m}$ by the t×s matrix $L_{t \times s}$ on the left and by the m×n matrix $R_{m \times n}$ on the right:

$$L_{t \times s} Y_{s \times m} R_{m \times n} =$$

$$X_{t \times n} = \begin{pmatrix} l_{11} & \ldots & l_{1s} \\ \vdots & \ddots & \vdots \\ l_{t1} & \ldots & l_{ts} \end{pmatrix} \begin{pmatrix} y_{11} & \ldots & y_{1m} \\ \vdots & \ddots & \vdots \\ y_{s1} & \ldots & y_{sm} \end{pmatrix} \begin{pmatrix} r_{11} & \ldots & r_{1n} \\ \vdots & \ddots & \vdots \\ r_{m1} & \ldots & r_{mn} \end{pmatrix} = \begin{pmatrix} x_{11} & \ldots & x_{1n} \\ \vdots & \ddots & \vdots \\ x_{t1} & \ldots & x_{tn} \end{pmatrix}.$$

As described above, representative WET parameter measurements of the semiconductor device and/or devices and/or process layers formed on the workpiece 405, which were performed in WET measuring steps and subsequently stored in the historical database 130, may include current measurements and/or voltage responses of the MOS transistors 500 formed on the workpiece 405, for example, and/or capacitances and/or resistances and/or resistivities of elements of the MOS transistors 500 formed on the workpiece 405. For example, the WET parameters of the MOS transistors 500 formed on the workpiece 405 may include measurements of the drain-source current $I_D$ at different values of the drain voltage $V_D$, gate voltage $V_G$ and/or substrate voltage (or bias) $V_{BS}$. By measuring change in the drain-source current $I_D$ with change in the drain voltage $V_D$, at constant gate voltage $V_G$, the channel conductance $g_D$ may be determined from $$g_D = \frac{\partial I_D}{\partial V_D}\bigg|_{V_G = const.} = \frac{Z}{L} \mu_n C_i (V_G - V_T),$$

where Z is the channel width (in the direction perpendicular to the plane of the MOS transistor 500 in FIG. 5), $\mu_n$ is the mobility of the electrons (related to the drift velocity $v_{ndrift}$ of the electrons by $v_{ndrift} = \mu_n E$, where $E = V_D/L$ is the electric field across the drain/source), $C_i$ is the capacitance per unit area ($C_i = \epsilon_{ox}/t_{ox}$, where $\epsilon_{ox} \approx 4$ is the dielectric constant for the gate oxide 415), and $V_T$ is the threshold voltage of the MOS transistor 500. Similarly, by measuring change in the drain-source current $I_D$ with change in the gate voltage $V_G$, at constant drain voltage $V_D$, the transconductance $g_m$ may be determined from $$g_m = \frac{\partial I_D}{\partial V_G}\bigg|_{V_G = const.} = \frac{Z}{L} \mu_n C_i V_C.$$

Here, the linear region of drain-source current $I_D$ versus drain voltage $V_D$ is used, where $$I_D \approx \left(\frac{Z}{L}\right) \mu_n C_i (V_G - V_T) V_D,$$

for $V_D << (V_G - V_T)$, and the threshold voltage $V_T$ is given by $$V_T = 2\psi_B + \frac{\sqrt{2\epsilon_s q N_A (2\psi_B)}}{C_i},$$

where $\psi_B$ is the potential difference between the Fermi level $E_F$ in the doped-poly gate 410 and the intrinsic (flat-band) Fermi level $E_{Fi}$ in the P-type semiconducting substrate 405, $\epsilon_s$ is the dielectric constant for the P-type semiconducting substrate 405, q is the absolute value of the electric charge on an electron (q=1.60218×10$^{-19}$ Coulombs), and the doping level $N_A$ reflects the density of acceptor impurities for the P-type semiconducting substrate 405.

The WET measurements, requested from the historical database 130 by the WET parameter request 125, for example, represented generally by a vector x (here β=n=1 for $x_\beta$), such as those given above, may be put into an MOS transistor model, represented generally by a function T(x), which maps the WET measurements x into a set of parameters, represented generally by a vector y (here α=m=1 for $y_\alpha$), characteristic of the processing performed in at least one of the processing steps during the formation of an MOS transistor such as the MOS transistor 500, so that T(x)=y. The transistor model may be inverted, represented generally by a function $T^{-1}(y)=x$, which maps the characteristic processing parameters y into the WET measurements x.

For example, one illustrative embodiment of an MOS transistor model function T(x) gives the minimum channel length $L_{min}$ (related to the doped-poly gate 410 width W) for which long-channel subthreshold behavior can be observed. In this illustrative embodiment, the MOS transistor model function T(x) gives the minimum channel length $L_{min}$ by the simple empirical relation: $L_{min} = 0.4[d_j t_{ox}(W_S + W_D)^2]^{1/3}$, measured in μm, where the junction depth $d_j$ is measured in μm, the gate oxide 415 thickness $t_{ox}$ is the numerical value of the number of Å units (so the dimensions work out), and ($W_S + W_D$) is the sum of the source and drain depletion depths, respectively, also measured in μm. In a one-dimensional abrupt junction formulation, the source depletion depth $W_S$ may be given by:

$$W_S = \sqrt{\frac{2\epsilon_s}{qN_A}(V_{bi} + B_{BS})}$$

and the drain depletion depth $W_D$ may be given by:

$$W_D = \sqrt{\frac{2\epsilon_s}{qN_A}(V_D + V_{bi} + V_{BS})},$$

where and $V_{bi}$ is the built-in voltage of the junction.

Another illustrative embodiment of an MOS transistor model function T(x) gives the minimum channel length $L_{min}$ by the more complicated empirical relation: $L_{min} = Af_1(\delta V_T/$ $\delta V_D)[f_2(t_{ox})+B][f_3(W_S+W_D)+C][f_4(d_j)+D]$, where the functions $f_i$, for i=1,2,3,4, and the constants A, B, C, D, may be determined by fitting this equation for the minimum channel length $L_{min}$ to device simulations. For example, $f_1(\delta V_T/\delta V_D) = (\delta V_T/\delta V_D)^{-0.37}$, $f_2(t_{ox})=t_{ox}$, $f_3(W_S+W_D)=W_S+W_D$, $f_4(d_j) = d_j$, A=2.2 $\mu m^{-2}$, B=0.012 $\mu m$, C=0.15 $\mu m$, and D=2.9 $\mu m$ appear to give a good fit. In this illustrative embodiment, the inverted MOS transistor model function $T^{-1}(y)$ gives the variation $(\delta V_T/\delta V_D)$ of the threshold voltage $V_T$ with the drain voltage $V_D$, for example, by the more complicated empirical relation: $\delta V_T/\delta V_D = f_1^{-1}(L_{min}/\{A[f_2(t)+B][f_3(W_S+W_D)+C][f_4(d_j)+D]\})$. For the fit where $f_1(\delta V_T/\delta V_D) = (\delta V_T/\delta V_D)^{-0.37}$, $f_1^{-1}(y)=(y)^{-1/(0.37)}$, for example.

Figure 6:
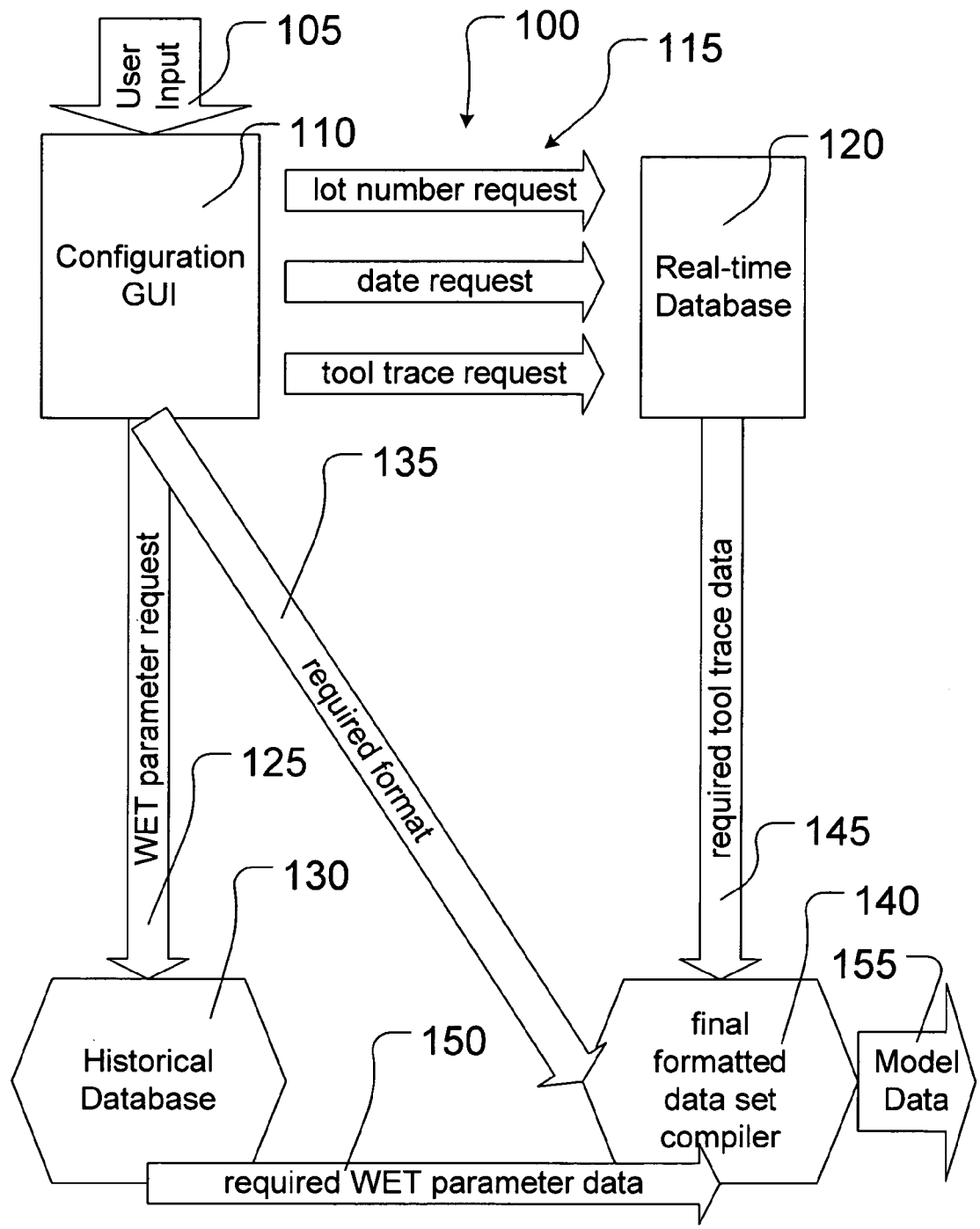

As shown in FIG. 6, a required format signal 135 is sent from the configuration GUI 110 and delivered to a final formatted data set compiler 140. The final formatted data set compiler 140 produces the final data set, such as the model data set 155, as described more fully below in reference to FIG. 9.

Figure 7:
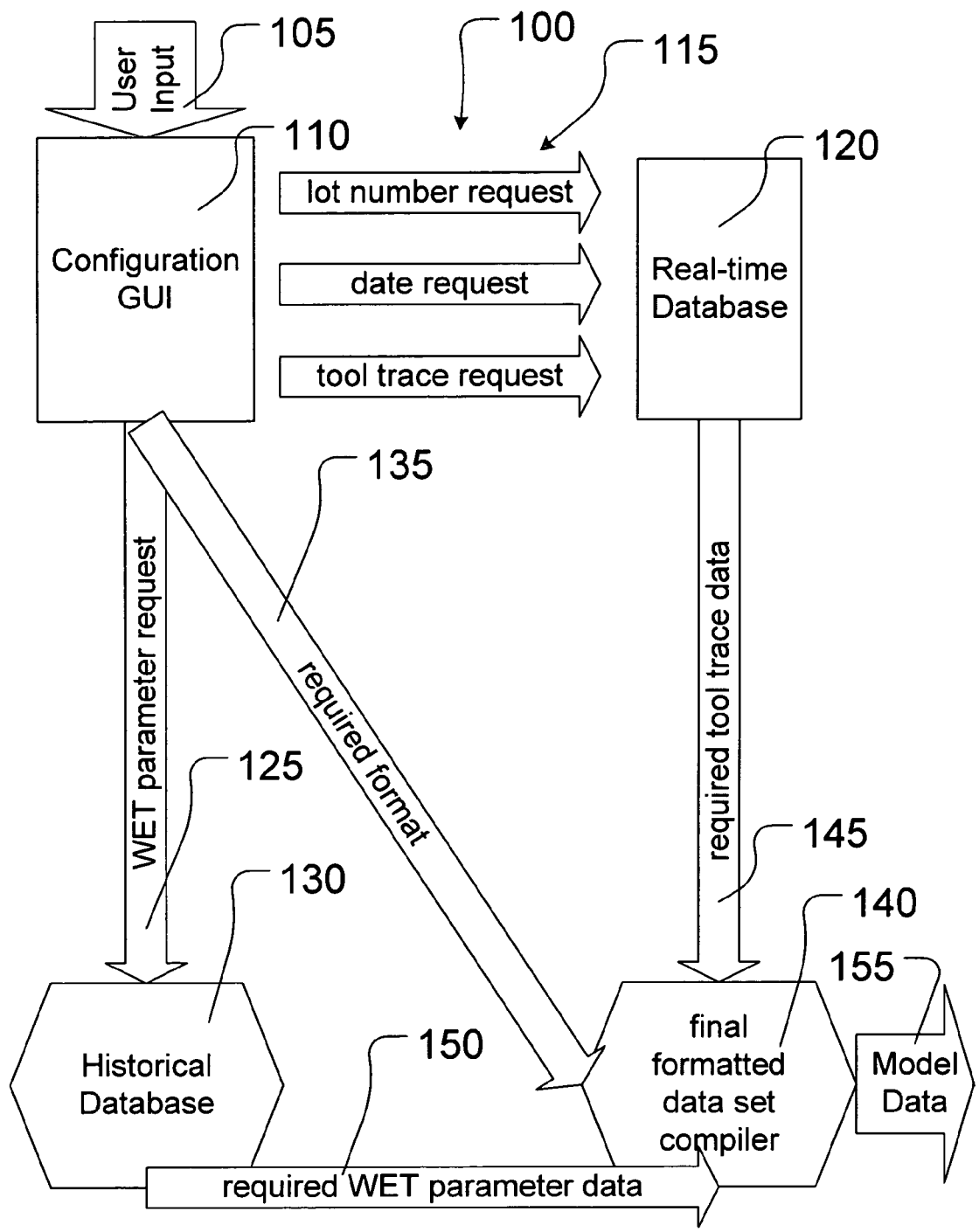

As shown in FIG. 7, a required tool trace data signal 145 is sent from the real-time database 120 and delivered to the final formatted data set compiler 140. The required tool trace data signal 145 may be selected from the real-time database 120 based on the request(s) 115 sent from the configuration GUI 110 to the real-time database 120, as described above in reference to FIG. 2.

Figure 8:
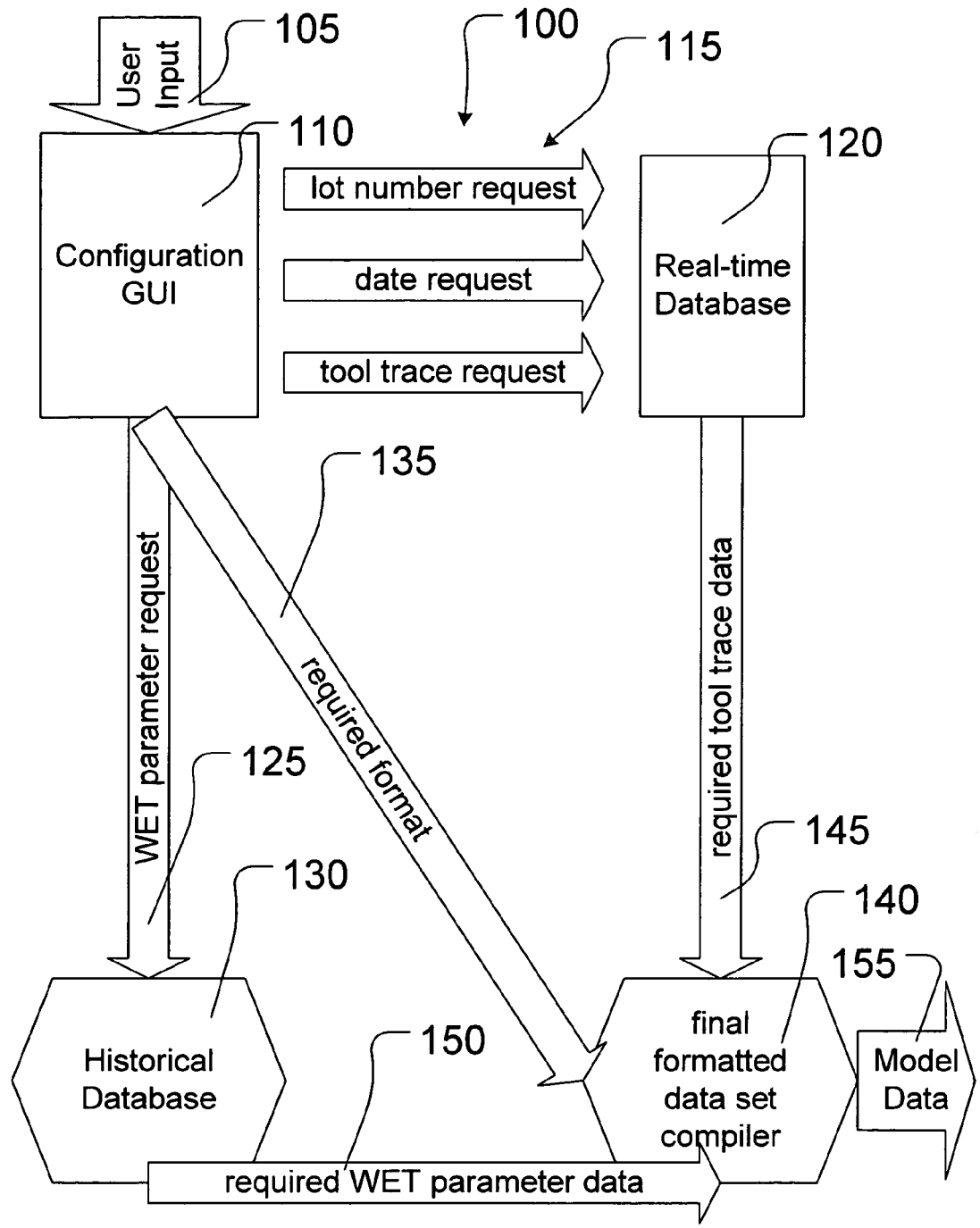

As shown in FIG. 8, a required WET parameter data signal 150 is sent from the historical database 130 and delivered to the final formatted data set compiler 140. The required WET parameter data signal 150 may be selected from the historical database 130 based on the WET parameter request 125 sent from the configuration GUI 110 to the historical database 130, as described above in reference to FIG. 3.

Figure 9:
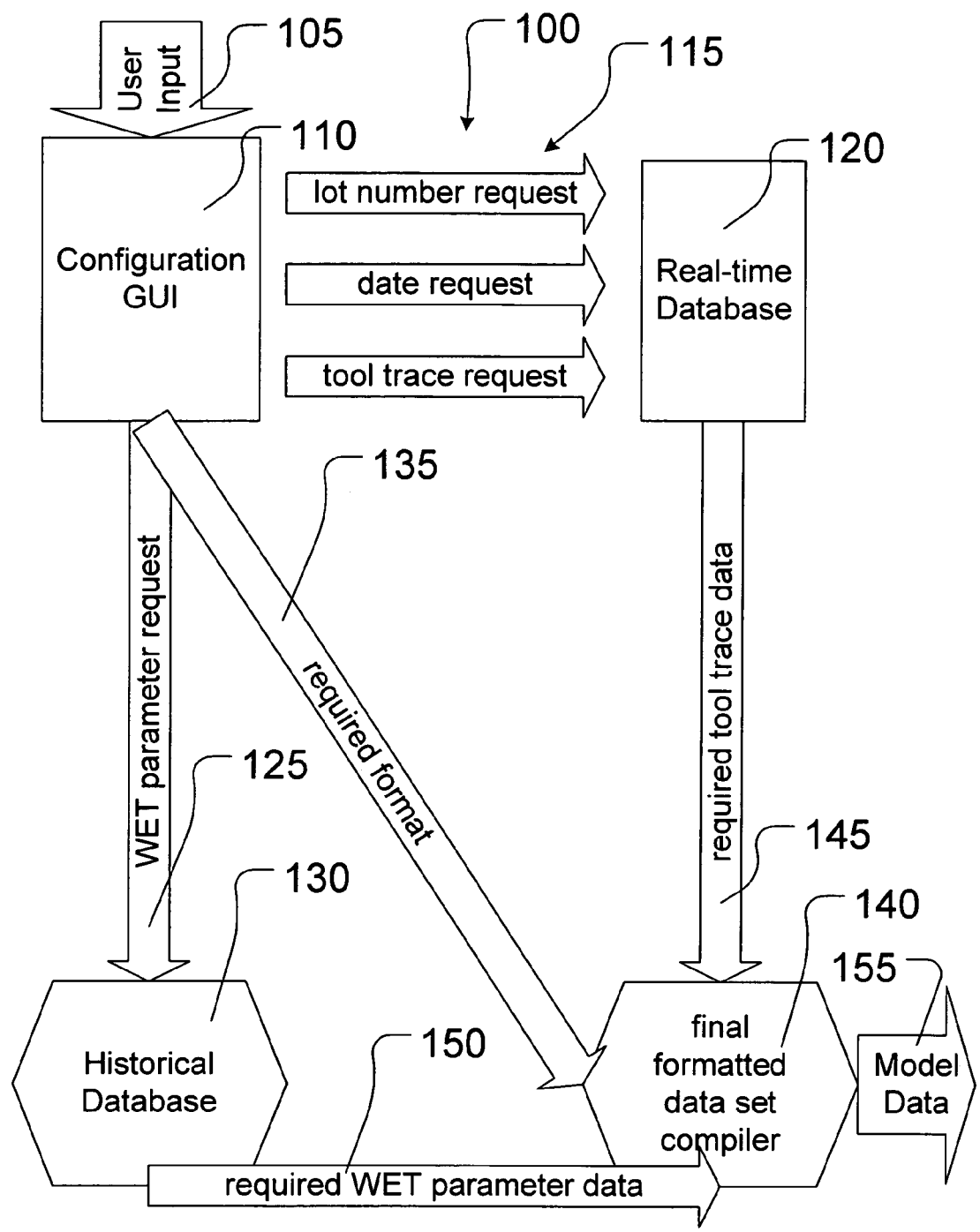

As shown in FIG. 9, the final formatted data set compiler 140 produces the final data set, such as the model data set 155, by combining the required tool trace data signal 145 with the required WET parameter data signal 150, using the required format signal 135 sent from the configuration GUI 110. The final data set, such as the model data set 155, may be used for model building, to model a process or processes used in fabricating a semiconductor device such as the MOS transistor 500, as described above in reference to FIGS. 4 and 5. In various alternative embodiments, if the processing tool were a rapid thermal anneal (RTA) tool, then the requested and required tool trace data 145 may trace the effective temperature T of the RTA tool for a given period of time such as the duration of the RTA of the workpiece, and the requested and required WET parameter data 150 may relate to the resistivity of the material annealed in the RTA, so that the resistivity of the material annealed in the RTA may be correlated in an RTA model to the effective temperature T of the RTA tool for a given period of time such as the duration of the RTA of the workpiece.

In various illustrative embodiments, the process engineer may be provided with advanced process data monitoring capabilities, such as the ability to provide historical parametric data in a user-friendly format, as well as event logging, real-time graphical display of both current processing parameters and the processing parameters of the entire run, and remote, i.e., local site and worldwide, monitoring. These capabilities may engender more optimal control of critical processing parameters, such as throughput accuracy, stability and repeatability, processing temperatures, mechanical tool parameters, and the like. This more optimal control of critical processing parameters reduces this variability. This reduction in variability manifests itself as fewer within-run disparities, fewer run-to-run disparities and fewer tool-to-tool disparities. This reduction in the number of these disparities that can propagate means fewer deviations in product quality and performance. In such an illustrative embodiment of a method of manufacturing according to the present invention, a monitoring and diagnostics system may be provided that monitors this variability and optimizes control of critical parameters.

Any of the above-disclosed embodiments of a method of manufacturing according to the present invention enables the automatic and time-saving extraction and combination of data sets, in the proper, user-chosen format, for making correlations between processing and/or tool trace data, on the one hand, and testing data, such as WET measurements, on the other. Additionally, any of the above-disclosed embodiments of a method of manufacturing according to the present invention enables semiconductor device fabrication with increased device accuracy and precision, increased efficiency and increased device yield, enabling a streamlined and simplified process flow, thereby decreasing the complexity and lowering the costs of the manufacturing process and increasing throughput.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of configuring a final data set to use for modeling a manufacturing process, the method comprising:
   requesting a real-time data set from a real-time database;
   requesting an historical data set from an historical database;
   defining a required format for the final data set; and
   combining the real-time data set from the real-time database with the historical data set from the historical database using the required format for the final data set.

2. The method of claim 1, wherein requesting the real-time data set comprises requesting the real-time data set using a user interface.

3. The method of claim 2, wherein requesting the real-time data set from the real-time database includes requesting a tool trace data set from the real-time database.

4. The method of claim 3, wherein requesting the real-time data set from the real-time database using the user interface comprises requesting the real-time data set from the real-time database using a graphical user interface (GUI) to request the tool trace data set from the real-time database.

5. The method of claim 3, wherein requesting the tool trace data set from the real-time database includes requesting the tool trace data set from the real-time database using one of a lot number and a date.

6. The method of claim 1, wherein requesting the historical data set from the historical database includes requesting a wafer electrical test (WET) measurement parameter set from the historical database.

7. The method of claim 1, wherein requesting the historical data set from the historical database includes requesting the historical data set from the historical database using a user interface to request the historical data set from the historical database.

8. The method of claim 7, wherein requesting the historical data set from the historical database using the user interface includes requesting the historical data set from the historical database using a graphical user interface (GUI).

9. The method of claim 8, wherein using the GUI to request the historical data set from the historical database includes using the GUI to request a wafer electrical test (WET) measurement parameter set from the historical database.

10. The method of claim 1, further comprising providing user input using a user interface.

11. The method of claim 10, wherein providing the user input using the user interface comprises providing a user input using a graphical user interface.

12. The method of claim 10, wherein requesting the real-time data set comprises requesting the real-time data set based upon the user input.

13. The method of claim 10, wherein requesting the historical data set comprises requesting the historical data set based upon the user input.

14. The method of claim 10, wherein defining the required format comprises defining the required format based upon the user input.

15. The method of claim 1, further comprising forming the model of the manufacturing process using the final data set.

16. The method of claim 15, further comprising processing at least one wafer using the model of the manufacturing process.

17. A computer-readable, program storage device encoded with instructions that, when executed by a computer, perform a method for configuring a final data set to use for modeling a manufacturing process, the method comprising:
   requesting a real-time data set from a real-time database;
   requesting an historical data set from an historical database;
   defining a required format for the final data set; and
   combining the real-time data set from the real-time database with the historical data set from the historical database using the required format for the final data set.

18. The computer-readable, program storage device of claim 17, wherein requesting the real-time data set comprises requesting, the real-time data set using a user interface.

19. The computer-readable, program storage device of claim 18, wherein requesting the real-time data set from the real-time database includes requesting a tool trace data set from the real-time database.

20. The computer-readable, program storage device of claim 19, wherein requesting the real-time data set from the real-time database using the user interface comprises requesting the real-time data set from the real-time database using a graphical user interface (GUI) to request the tool trace data set from the real-time database.

21. The computer-readable, program storage device of claim 19, wherein requesting the tool trace data set from the real-time database includes requesting the tool trace data set from the real-time database using one of a lot number and a date.

22. The computer-readable, program storage device of claim 17, wherein requesting the historical data set from the historical database includes requesting a wafer electrical test (WET) measurement parameter set from the historical database.

23. The computer-readable, program storage device of claim 17, wherein requesting the historical data set from the historical database includes requesting the historical data set from the historical database using a user interface to request the historical data set from the historical database.

24. The computer-readable, program storage device of claim 23, wherein requesting the historical data set from the historical database using the user interface includes requesting the historical data set from the historical database using a graphical user interface (GUI).

25. The computer-readable, program storage device of claim 24, wherein using the GUI to request the historical data set from the historical database includes using the GUI to request a wafer electrical test (WET) measurement parameter set from the historical database.

26. A computer programmed to perform a method of configuring a final data set to use for modeling a manufacturing process, the method comprising:
   requesting a real-time data set from a real-time database;
   requesting an historical data set from an historical database;
   defining a required format for the final data set; and
   combining the real-time data set from the real-time database with the historical data set from the historical database using the required format for the final data set.

27. The computer of claim 26, wherein requesting the real-time data set comprises requesting the real-time data set using a user interface.

28. The computer of claim 27, wherein requesting the real-time data set from the real-time database includes requesting a tool trace data set from the real-time database.

29. The computer of claim 28, wherein requesting the real-time data set from the real-time database using the user interface comprises requesting the real-time data set from the real-time database using a graphical user interface (GUI) to request the tool trace data set from the real-time database.

30. The computer of claim 28, wherein requesting the tool trace data set from the real-time database includes requesting the tool trace data set from the real-time database using one of a lot number and a date.

31. The computer of claim 26, wherein requesting the historical data set from the historical database includes requesting a wafer electrical test (WET) measurement parameter set from the historical database.

32. The computer of claim 26, wherein requesting the historical data set from the historical database includes requesting the historical data set from the historical database using a user interface to request the historical data set from the historical database.

33. The computer of claim 32, wherein requesting the historical data set from the historical database using the user interface includes requesting the historical data set from the historical database using a graphical user interface (GUI).

34. The computer of claim 33, wherein using the GUI to request the historical data set from the historical database includes using the GUI to request a wafer electrical test (WET) measurement parameter set from the historical database.

35. A method of configuring a final data set for modeling a semiconductor fabrication process, the method comprising:
   providing user input using a user interface;
   requesting a tool processing data set from a tool processing database based upon the user input;
   requesting a wafer electrical test data set from a wafer electrical test database based upon the user input;
   defining a required format for the final data set based upon the user input; and combining the tool processing data set with the wafer electrical test data set to form the final data set in the required format.

36. The method of claim 35, wherein providing the user input comprises providing the user input using a graphical user interface.

37. The method of claim 35, wherein requesting the tool processing data set comprises requesting at least one of a tool trace data set, a time trace report, a date request, and a lot number request.

38. The method of claim 35, wherein requesting the tool processing data set from the tool processing database comprises requesting the tool processing data set from a real-time tool processing database.

39. The method of claim 35, wherein requesting the wafer electrical test data set from the wafer electrical test database comprises requesting the wafer electrical test data set from an historical wafer electrical test database.

40. The method of claim 35, wherein requesting the wafer electrical test data set comprises requesting at least one of a current, a voltage, a capacitance, a resistance, and a resistivity of an element of a MOS transistor.

* * * * *